(12) United States Patent
Gang

(10) Patent No.: US 6,225,834 B1
(45) Date of Patent: May 1, 2001

(54) BIT LINE SENSE AMPLIFIER

(75) Inventor: Yung Jin Gang, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/468,360

(22) Filed: Dec. 21, 1999

(30) Foreign Application Priority Data

Dec. 23, 1998 (KR) .................................................. 98-57506

(51) Int. Cl.⁷ .................................................. G01R 19/00
(52) U.S. Cl. .................................. 327/55; 327/51; 327/57
(58) Field of Search .................................. 327/51, 52, 53, 327/54, 55, 56, 57; 365/205, 207, 208, 154

(56) References Cited

U.S. PATENT DOCUMENTS

| | | | |
|---|---|---|---|
| 4,896,196 | 1/1990 | Blanchard et al. | 257/139 |
| 5,434,443 | 7/1995 | Kelly et al. | 257/467 |
| 5,670,388 | 9/1997 | Machesney et al. | 438/164 |
| 5,726,844 | 3/1998 | Smith | 361/56 |
| 5,729,492 * | 3/1998 | Campardo | 365/185.21 |
| 5,804,992 * | 9/1998 | Lee | 327/51 |
| 5,847,422 | 12/1998 | Chi et al. | 257/291 |
| 5,923,202 | 7/1999 | Merrill | 327/318 |
| 5,942,919 * | 8/1999 | Ang et al. | 327/57 |

* cited by examiner

Primary Examiner—Kenneth B. Wells
Assistant Examiner—Paul Dinh
(74) Attorney, Agent, or Firm—Nath & Associates PLLC; Gary M. Nath; Harold L. Novick

(57) ABSTRACT

The present invention relates to a bit line sense amplifier for a semiconductor memory device, and in particular to a data sense amplifier which can increase a data sensing speed and improve an operational speed of a chip by using a current sensing method in data-sensing a bit line having a large capacitive load. The bit line sense amplifier according to the present invention includes: a switch unit interrupting a capacitive load of the bit line; a charging current generating unit rapidly generating a charging current to a sense amp output terminal; and an output potential control unit rapidly converting a potential of the sense amp output terminal to a ground voltage level or a power voltage level. As a result, even if a large capacitive load is applied to the bit line, a high-speed charging operation can be carried out, thereby improving the operational speed of the chip.

6 Claims, 7 Drawing Sheets

BIT LINE SENSE AMPLIFIER

BACKGROUND OF THE INVENTION

1. Field of the Invention

The present invention relates to a bit line sense amplifier for a semiconductor memory device, and in particular to a bit line sense amplifier which can increase a data sensing speed and improve an operational speed of a chip by using a current sensing method in data-sensing a bit line having a large capacitive load.

2. Description of the Background Art

FIG. 1 illustrates a conventional bit line sense amplifier. As shown therein, the conventional bit line sense amplifier is a cross-coupled latch type bit line sense amplifier which senses a data according to a charge sensing method, and amplifies and outputs the data.

According to the charge sensing method, in case charge sharing takes place according to a charge conservation law in regard to charges stored in a data storage capacitor of a memory cell selected by bit lines BL, /BL having a half VCC voltage (approximately ½ VCC) level due to equalization and precharge, a small voltage difference (at most, a few hundreds mv) is generated between the bit line pair BL, /BL.

Thereafter, the bit line sense amplifier senses the voltage difference, controls and amplifies the sensed voltage difference according to sense amp driving signals RTO, /SE, and outputs it to a data bus line. At the same time, the bit line sense amplifier writes back the same data in the data storage capacitor of the selected memory cell.

In the charge sensing method, a great capacitive load is applied to a sense amp line and the bit lines BL, /BL during a sensing operation, and thus a delay is often generated when the small voltage difference is amplified and outputted to an output terminal.

This phenomenon increases an access time in a high-speed memory device, thereby reducing an output speed of the data.

SUMMARY OF THE INVENTION

Accordingly, it is an object of the present invention to provide a bit line sense amplifier which can be operated at a high speed by generating, rapidly sensing and amplifying a large current during a sensing operation according to a current sensing method.

In order to achieve the above-described object of the present invention, in a cross-coupled latch type data sense amplifier, a bit line sense amplifier includes: a first switch unit operated according to a sense amp enable signal, and interrupting a capacitive load of one-side bit line from a sense amp one-side output terminal in a sensing operation; a first charging current generating unit turned on by a precharge voltage of the one-side bit line, and rapidly outputting a charging current generated from the sense amp enable signal to the sense amp one-side output terminal; a second switch unit operated according to the sense amp enable signal, and interrupting a capacitive load of the other-side bit line from a sense amp other-side output terminal in the sensing operation; a second charging current generating unit turned on by a precharge voltage of the other-side bit line, and rapidly outputting the charging current generated from the sense amp enable signal to the sense amp other-side output terminal; a first output potential control unit and a second output potential control unit connected between an output terminal of the charging current generating unit and an input terminal of a sense amp control signal, and rapidly converting a potential of the sense amp output terminal to a ground voltage level in the sensing operation; a capacitor connected between the one-side output terminal of the sense amplifier and the ground, and charging the charging current; and a cross-coupled latch unit connected between the output terminal of the charging current generating unit and the input terminal of the sense amp control signal, and rapidly converting the potential of the sense amp output terminal to a power voltage level.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

The constitution and operation of a bit line sense amplifier in accordance with the present invention will now described in detail with reference to the accompanying drawings.

Figure 3:
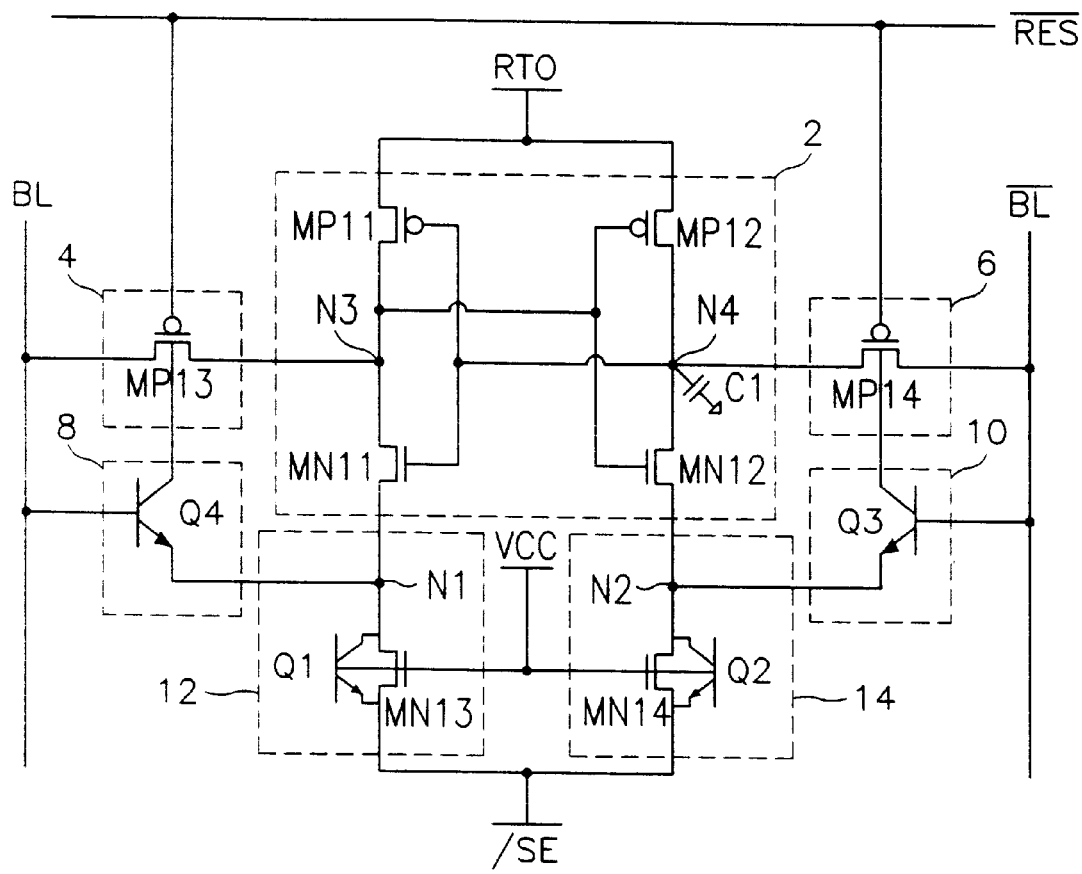
FIG. 3 illustrates a current sensing bit line sense amplifier in accordance with a preferred embodiment of the present invention.

FIG. 3 illustrates the bit line sense amplifier using a current sensing method in accordance with a preferred embodiment of the present invention. As shown therein, the bit line sense amplifier in accordance with the present invention includes bipolar junction transistors and MOS transistors, in addition to a conventional cross-coupled latch type bit line sense amplifier, thereby improving a sensing speed.

The bit line sense amplifier includes: a cross-coupled latch unit 2 consisting of two PMOS transistors MP11, MP12 and two NMOS transistors MN11, MN12 between a sense amp control signal RTO and first and second nodes N1, N2; a first output potential control unit 12 consisting of an NMOS transistor MN13 having its gate connected to receive a power voltage VCC, and a lateral NPN bipolar junction transistor Q1 having its base connected to receive the power voltage VCC, the NMOS transistor MN13 and the lateral NPN bipolar junction transistor Q1 being connected in parallel between the first node N1 and an input terminal of a sense amp control signal /SE; a second output potential control unit 14 consisting of an NMOS transistor MN14 having its gate connected to receive the power voltage VCC, and an NPN bipolar junction transistor Q2 having its base connected to receive the power voltage VCC, the NMOS transistor MN14 and the NPN bipolar junction transistor Q2 being connected in parallel between the second node N2 and the input terminal of the sense amp control signal /SE; a first switch unit 4 consisting of a PMOS transistor MP13 having its gate connected to receive a sense amp enable signal /RES, and connected between an output terminal N3 of the cross-coupled latch unit 2 and a bit line BL; a second switch unit 6 consisting of a PMOS transistor MP14 having its gate connected to receive the sense amp enable signal /RES, and connected between an output terminal N4 of the cross-coupled latch unit 2 and a bit line /BL; a first charging current generating unit 8 consisting of an NPN bipolar junction transistor Q4 turned on according to a potential of the bit line BL applied to its base, and outputting a charging current generated by the sense amp enable signal /RES to the first node N1; and a second charging current generating unit 10 consisting of an NPN bipolar junction transistor Q3 turned on according to a potential of the bit line /BL applied to its base, and outputting the charging current generated by the sense amp enable signal /RES to the second node N2.

The operation of the bit line sense amplifier in accordance with the present invention will now be described.

First, the bit line pair BL, /BL is precharged and equalized to a precharge voltage (approximately VCC/2). Here, at least, a precharge voltage VCC/2 level must be greater than a base-emitter voltage ($V_{BE} \geq 0.6V$) of the bipolar junction transistor.

Thereafter, when a data stored in a cell connected to one-side bit line /BL is read, the potential of the one-side bit line /BL is slightly increased, as compared with the precharge voltage VCC/2.

Here, the sense amp enable signal /RES is enabled at a high level, and applied to a collector of the bipolar transistor Q4 constituting the first charging current generating unit 8, and a collector of the bipolar transistor Q3 constituting the second charging current generating unit 10.

At the same time, the first switch unit 4 and the second switch unit 6 are turned off.

In addition, the potential of the one-side bit line /BL is applied to the base of the bipolar transistor Q3 constituting the second charging current generating unit 10, and the charging current is charged in a capacitor C1 through the turned-on bipolar transistor Q3.

It is because a resistance of the NMOS transistor MN2 is smaller than a combined resistance of the second output potential control unit 14.

On the other hand, the other-side bit line BL maintains the precharge voltage VCC/2 level, and thus the precharge voltage VCC/2 is applied to the base of the bipolar transistor Q4 constituting the first charging current generating unit 8.

Accordingly, the bipolar transistor Q4 constituting the first charging current generating unit 8 is turned on by the precharge voltage VCC/2, and a current smaller than the charging current of the second charging current generating unit 10 flows thereto.

The difference of the current flowing into sources of the NMOS transistors MN11, MN12 instantly drops a voltage of the output node N3 having a smaller current to the ground voltage VSS level (/SE level), and raises a voltage of the output node N4 having a greater current to the power voltage VCC level (RTO level), by means of the MOS transistors MN11, MN12, MP11, MP12 constituting the cross-coupled latch unit 2, thereby finishing the sensing operation.

Thereafter, when the sense amp enable signal /RES is transited from high to low, the first and second charging current generating units 8, 10 are turned off, the PMOS transistors MP13, MP14 constituting the first and second switch units 4, 6 are turned on, and thus the levels of the output nodes N3, N4 are transmitted to the bit lines BL, /BL as they are. Accordingly, a restore operation required for a dynamic random access memory DRAM is performed.

On the other hand, during the sensing operation, the potential of the output node N4 is relatively higher than that of the output node N3, and thus recognized as a high level. Therefore, the first output potential control unit 12 turns off the PMOS transistor MP11 of the cross-coupled latch unit 2, and turns on the NMOS transistor MN11 thereof, thereby dropping the potential of the output node to the ground voltage VSS level.

Here, the bipolar transistor Q1 and the NMOS transistor MN13 constituting the first output potential control unit 12 serve to rapidly form a current path.

The state where the cell is connected to the one-side bit line /BL is exemplified above. In case the data storage cell is connected to the other-side bit line, an operation opposite to the above-described operation is performed.

Figure 4:
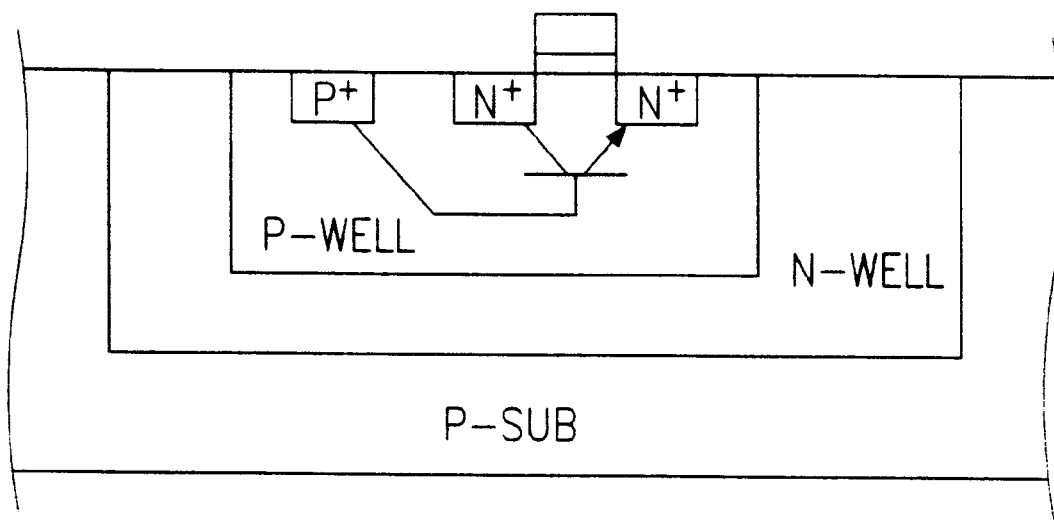
FIG. 4 is a cross-sectional diagram illustrating a gate-base-body connected hybrid transistor of the bit line sense amplifier in FIG. 3.

FIG. 4 is a cross-sectional diagram illustrating a gate-base-body connected hybrid transistor of the first and second output potential control units (parallel connections of MN14 and Q2, and MN13 and Q1) and the first and second charging current generating units, as shown in FIG. 3.

Here, the bipolar junction transistor does not need a new area, but uses a lateral bipolar junction transistor existing below the NMOS transistor.

Especially, since it is a gated lateral bipolar junction transistor type, a gate is directly connected to a bulk. As a result, a threshold voltage Vt is lowered, and thus a low voltage application may be efficiently carried out.

Figure 5A:
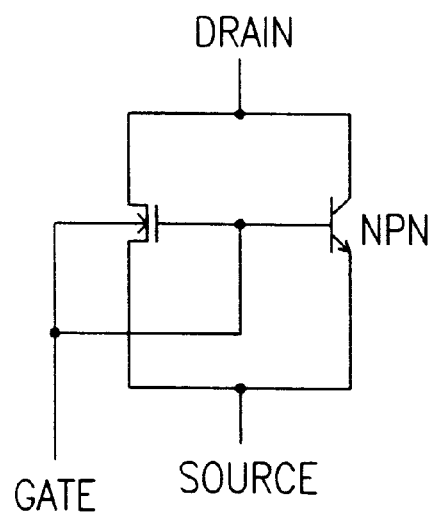
FIGS. 5a and 5b depict two types of symbols of the gate-base-body connected hybrid transistor of the bit line sense amplifier in FIG. 3.
Figure 5B:
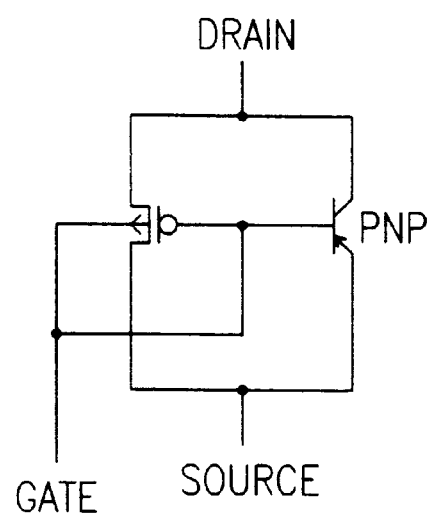

FIG. 5a depicts a symbol of a gate-base-body connected hybrid transistor of the NMOS transistor and the NPN bipolar junction transistor, and FIG. 5b depicts a symbol of a gate-base-body connected hybrid transistor of the PMOS transistor and a PNP bipolar junction transistor.

Figure 6:
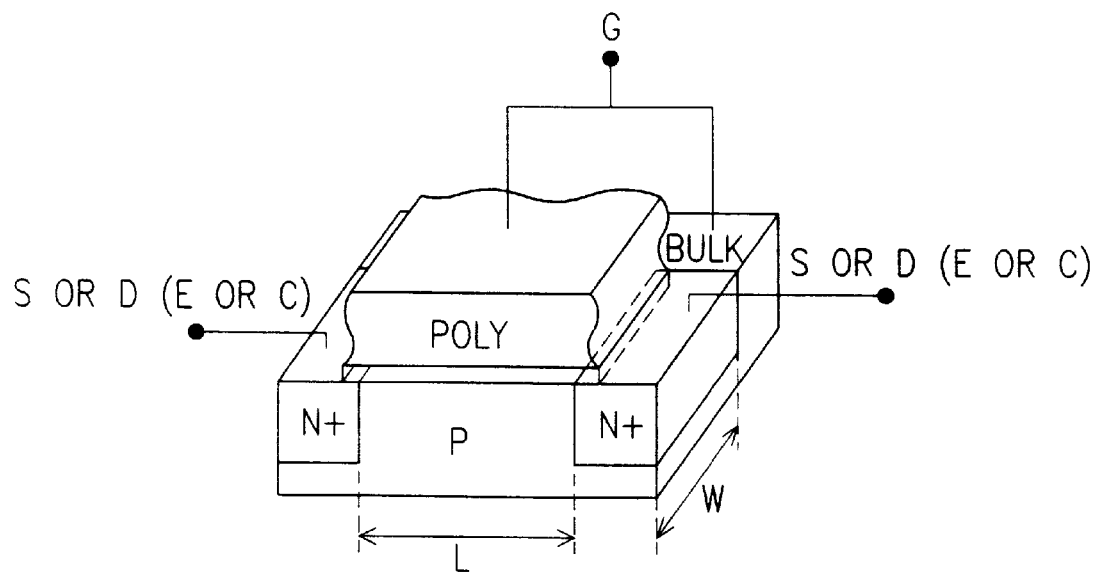
FIG. 6 is a three-dimensional diagram of the gate-base-body connected hybrid transistor as shown in FIG. 4.

FIG. 6 is a three-dimensional diagram of the gate-base-body connected hybrid transistor as shown in FIG. 4. As shown therein, the gate is directly connected to the bulk (body).

As shown therein, a channel length L corresponds to a base width of the bipolar junction transistor. Accordingly, as it becomes smaller than a submicron, a current amplification rate is increased.

In case there is a sufficient area, a pure bipolar junction transistor may be employed.

Figure 1:
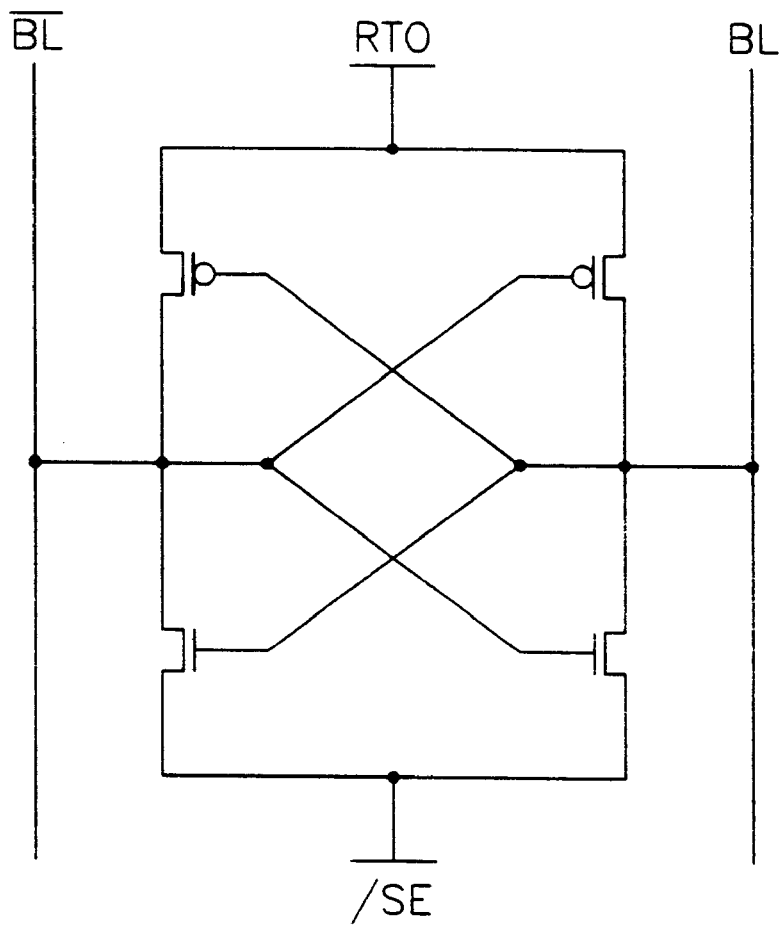
FIG. 1 illustrates a conventional charge sensing bit line sense amplifier.
Figure 2:
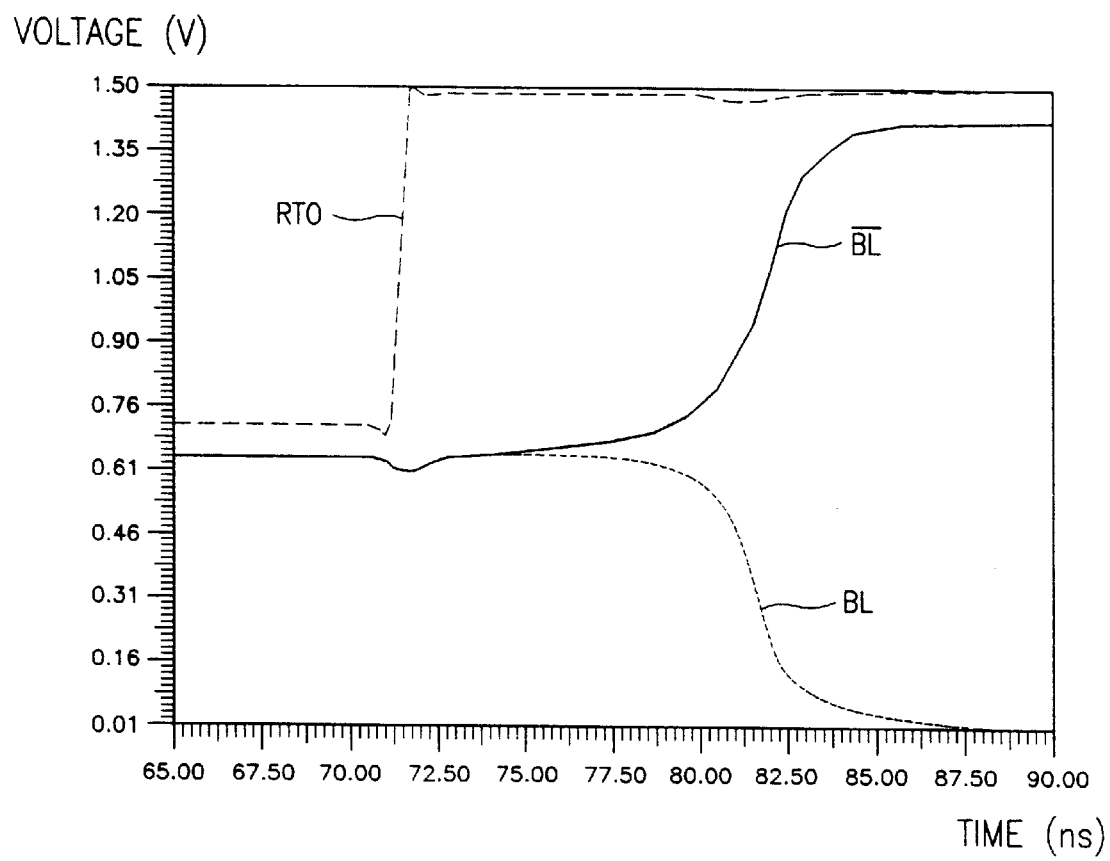
FIG. 2 is an operational waveform diagram of the conventional bit line sense amplifier in FIG. 1.
Figure 7:
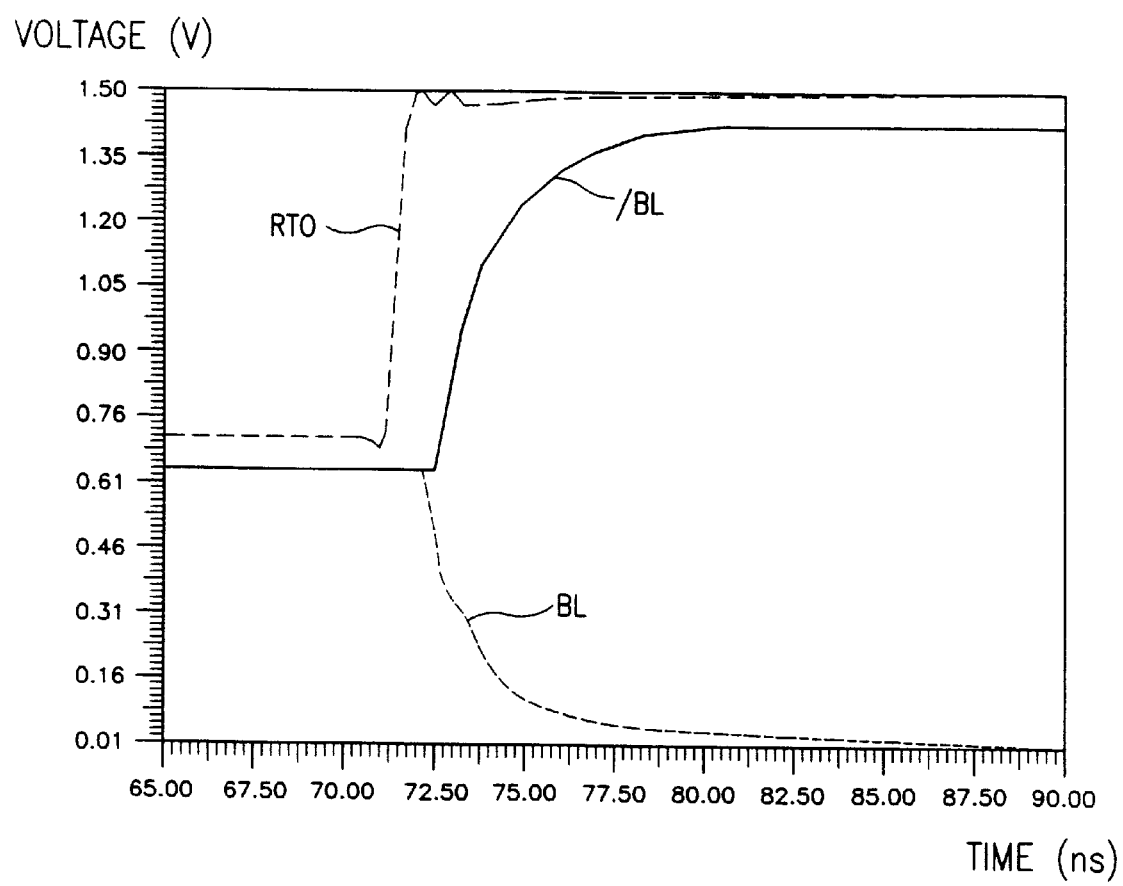
FIG. 7 is an operational waveform diagram of the bit line sense amplifier in FIG. 3.

Here, the NMOS transistor and the bipolar junction transistor are connected in parallel, thereby reducing a resistance of the gate-base-body connected hybrid transistor. Comparing the operational waveform diagram of the bit line sense amplifier in accordance with the present invention as shown in FIG. 7 with the operational waveform diagram of the conventional bit line sense amplifier as shown in FIG. 2, the sensing and amplification speed is remarkably improved according to the present invention.

As discussed earlier, the present invention employs the current sensing method, and thus can perform a high-speed charging operation, even if the large capacitive load is applied. Consequently, there are advantages in that the operational speed of the chip is improved, and that an additional area is not necessary.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. In a cross-coupled latch type bit line sense amplifier, a bit line sense amplifier comprises:

a first switch unit operated according to a sense amp enable signal, and interrupting a capacitive load of one-side bit line from a sense amp one-side output terminal in a sensing operation;

a first charging current generating unit turned on by a precharge voltage of the one-side bit line, and rapidly outputting a charging current generated from the sense amp enable signal to the sense amp one-side output terminal;

a second switch unit operated according to the sense amp enable signal, and interrupting a capacitive load of the other-side bit line from a sense amp other-side output terminal in the sensing operation;

a second charging current generating unit turned on by a precharge voltage of the other-side bit line, and rapidly outputting the charging current generated from the sense amp enable signal to the sense amp other-side output terminal;

a first output potential control unit and a second output potential control unit connected between an output terminal of the charging current generating unit and an input terminal of a sense amp control signal, and rapidly converting potentials of each sense amp output terminal to a ground voltage level in the sensing operation;

a capacitor connected between the one-side output terminal of the sense amplifier and the ground, and charging the charging current; and a cross-coupled latch unit, connected between the output terminal of the charging current generating unit and the input terminal of the sense amp control signal, and rapidly converting the potential of the sense amp output terminal to a power voltage level.

2. The bit line sense amplifier according to claim 1, wherein the first switch unit and the second switch unit respectively comprise a MOS transistor having its gate connected to receive the sense amp enable signal.

3. The bit line sense amplifier according to claim 1, wherein the first charging current generating unit and the second charging current generating unit comprise lateral bipolar junction transistors having their bases connected to one-side bit line and the other-side bit line, respectively, and existing below the MOS transistor.

4. The bit line sense amplifier according to claim 1, wherein the first output potential control unit and the second output potential control unit respectively comprise a gate-base-body connected hybrid transistor consisting of a MOS transistor having its gate connected to receive the power voltage, and a bipolar junction transistor having its base connected to receive the ground voltage, the MOS transistor and the bipolar junction transistor being connected in parallel.

5. The bit line sense amplifier according to claim 4, wherein the MOS transistor comprises an NMOS transistor, and the bipolar junction transistor comprises an NPN bipolar junction transistor.

6. The bit line sense amplifier according to claim 4, wherein the MOS transistor comprises a PMOS transistor, and the bipolar junction transistor comprises a PNP bipolar junction transistor.

* * * * *